United States Patent [19]

Mochizuki et al.

[11] Patent Number: 5,469,806
[45] Date of Patent: Nov. 28, 1995

[54] METHOD FOR EPITAXIAL GROWTH OF SEMICONDUCTOR CRYSTAL BY USING HALOGENIDE

[75] Inventors: Yuji Mochizuki; Yoshie Chiba; Toshikazu Takada; Akira Usui, all of Tokyo, Japan

[73] Assignee: NEC Corporation, Japan

[21] Appl. No.: 110,116

[22] Filed: Aug. 20, 1993

[30] Foreign Application Priority Data

Aug. 21, 1992 [JP] Japan .................... 4-222772

[51] Int. Cl.$^6$ .................................... C30B 25/14
[52] U.S. Cl. ........................ 117/97; 117/99; 117/102; 117/103
[58] Field of Search ................ 117/97, 99, 103, 117/102

[56] References Cited

U.S. PATENT DOCUMENTS 3,901,746  8/1975  Boucher ..................... 117/99
3,925,119  12/1975  Philbrick et al. ............ 117/99

FOREIGN PATENT DOCUMENTS 60-042816  3/1985  Japan ........................ 117/99

OTHER PUBLICATIONS

Zha et al., "The Production of Vibrationally Excited Hydrogen Molecules", J. Applied Physics, vol. 67(2), Jan. 15, 1990, pp. 604–610.
"GaAs Atomic Layer Epitaxy by Hydride VPE", Japanese Journal of Applied Physics, vol. 25, No. 3, Mar. 1986, pp. L212–L214, Ushi et al.

*Primary Examiner*—Robert Kunemund
*Attorney, Agent, or Firm*—Laff, Whitesel, Conte & Saret, Ltd.

[57] ABSTRACT

Epitaxial growth is carried out to form crystal such as GaAs, Si, etc. by using GaCl, $SiCl_2$, etc. In the epitaxial growth, Cl atoms are left on the crystal growth surface. The Cl atoms are removed in the form of HCl molecules by vibrationally-excited $H_2$ molecules.

2 Claims, 5 Drawing Sheets

METHOD FOR EPITAXIAL GROWTH OF SEMICONDUCTOR CRYSTAL BY USING HALOGENIDE

FIELD OF THE INVENTION

The invention relates to a method for epitaxial growth of semiconductor crystal by using halogenide, and more particularly to the acceleration of reaction rate in removing halogen atoms from an epitaxial growth surface by using $H_2$ molecules.

BACKGROUND OF THE INVENTION

At the epitaxial growing stage of semiconductor crystal by using halogenide (practically chloride), Ga atoms, Si atoms, etc. are supplied to a substrate under growth in the form of chloride molecules such as $GaCl$, $SiCl_2$, etc. and adsorbed to the surface of the substrate. Even after the adsorption of Ga, Si, etc., Cl atoms are left on the substrate, so that epitaxial growth of semiconductor crystal is not followed thereon, unless the Cl atoms are removed therefrom.

In a first conventional method for removing Cl atoms from an epitaxial growth surface, $H_2$ molecules of carrier gas for supplying chloride molecules on a substrate under growth are reacted with the Cl atoms to form HCl molecules which leave the growth surface.

In a second conventional method for removing Cl atoms from an epitaxial growth surface, H atom radicals which are formed by the plasma decomposition of $H_2$ molecules are used to remove Cl atoms from the epitaxial growth surface.

In the first conventional method, an activation energy as large as 40 to 50 kcal/mol is required to complete the HCl formation-reaction, when $H_2$ molecules are used to remove Cl atoms, because the reaction is endothermical. The activation energy is based on a translation energy of $H_2$ molecules which is determined by a temperature of a growth reaction chamber. For this reason, it is required that a temperature higher than a temperature for obtaining the surface adsorption of chloride molecules is set to promote the removal of Cl atoms. In a epitaxial growth method such as an atomic layer epitaxy, it is important that a temperature is set to be as low as possible to obtain a high control property.

In accordance with these aspects, there is a disadvantage in that a control precision inherent in the saturated-adsorption condition of chloride molecules can not be maintained, because a temperature can not be low in the removal of Cl atoms for the above described reasons. In addition, there is a further disadvantage in that a total crystal growth time is difficult to be shortened, unless the HCl formation reaction between $H_2$ molecules and surface Cl atoms is accelerated, because the removal reaction is at rate-determining step in one cycle for the surface growth.

In the second conventional method by using H radical, the removal of Cl atoms can be carried out without the restriction of temperature. However, there is a disadvantage in that undesired result such as etching on the surface is observed due to the high reactivity of H atom radicals.

SUMMARY OF THE INVENTION

Accordingly, it is an object of the invention to provide a method for epitaxial growth of semiconductor crystal by using halogenide in which the restriction of temperature is relieved.

It is a further object of the invention to provide a method for epitaxial growth of semiconductor crystal by using halogenide in which a total crystal growth time is shortened.

It is a still further object fo the invention to provide a method for epitaxial growth of semiconductor crystal by using halogenide in which undesired result such as etching on a semiconductor substrate surface does not occur.

According to the invention, a method for epitaxial growth of semiconductor crystal by using halogenide, comprising the steps of:

vibrational-exciting $H_2$ molecules to supply vibrationally-excited $H_2$ molecules to a surface of a semiconductor crystal substrate under epitaxial growth, the epitaxial growth being carried out by using halogenide, so that Cl atoms are left on the surface of the semiconductor crystal; and removing the Cl atoms on the surface of the semiconductor substrate in accordance with formation of HCl molecules between the vibrationally-excited $H_2$ molecules and the Cl atoms.

BRIEF DESCRIPTION OF THE DRAWINGS

The invention will be described in more detail in conjunction with appended drawings, wherein:

FIGS. 3 and 4 are diagrams of classical locus trajectories on the potential energy surface in the endothermic reaction in which HCl molecules are formed by colliding $H_2$ molecules to Cl atoms left on a crystal substrate, wherein FIG. 3 is for a case in which a translation energy of $H_2$ molecule is greater than a vibration energy thereof, and FIG. 4 is for a case in which the translation energy of $H_2$ molecule is smaller than the vibration energy.

DESCRIPTION OF THE PREFERRED EMBODIMENTS

A kinetic energy of $H_2$ molecule is represented by the sum of a translation energy $E_{tra}$, a vibration energy $E_{vib}$ and a rotation energy $E_{rot}$. Generally, a crystal growth reaction chamber is set at a temperature in the range of 400° to 100° C., at which the translation energy $E_{tra}$, the vibration energy $E_{vib}$ and the rotation energy $E_{rot}$ are represented by the equations (1) to (3).

$$E_{tra} = 3/2RT \tag{1}$$

where R is a gas constant, and T is an absolute temperature, $$E_{vib} = (v + \tfrac{1}{2})hv \tag{2}$$

where v is a quantum number of vibration, h is Planck's constant, and v is a vibration frequency, and $$E_{rot} = RT \tag{3}$$

Here, it is considered that the rotation energy $E_{rot}$ does not contribute significantly to the removal reaction of halogen atoms (especially Cl atoms in the invention), so that the rotation energy $E_{rot}$ will not be discussed hereinafter.

In a case where the vibration is not excited for $H_2$ molecules, the vibration quantum number V of $H_2$ molecules is zero at the minimum state, so that a provability for which an activation barrier is jumped over in the removal reaction fo Cl atoms which is the endothermical reaction is low. For the purpose of accelerating the removal reaction, the translation energy $E_{tra}$ must be increased by making a growth chamber temperature high. In the endothermic reaction, however, the transition state which determines the active energy is determined is located in the vicinity of the product system rather than the reactant system (to be explained later in FIGS. 3 and 4). Therefore, the acceleration effect obtained by the increase of the translation energy resulted from the increase of temperature is less than the acceleration effect obtained by the increase of the vibration energy.

For this reason, the vibration is excited for $H_2$ molecules in the invention, so that the vibration quantum number v becomes greater than zero (v>0). Thus, it will be possible to accelerate the removal reaction of Cl atoms by a lower transformation energy $E_{tra}$, that is, at a lower growth chamber temperature.

Figure 1:
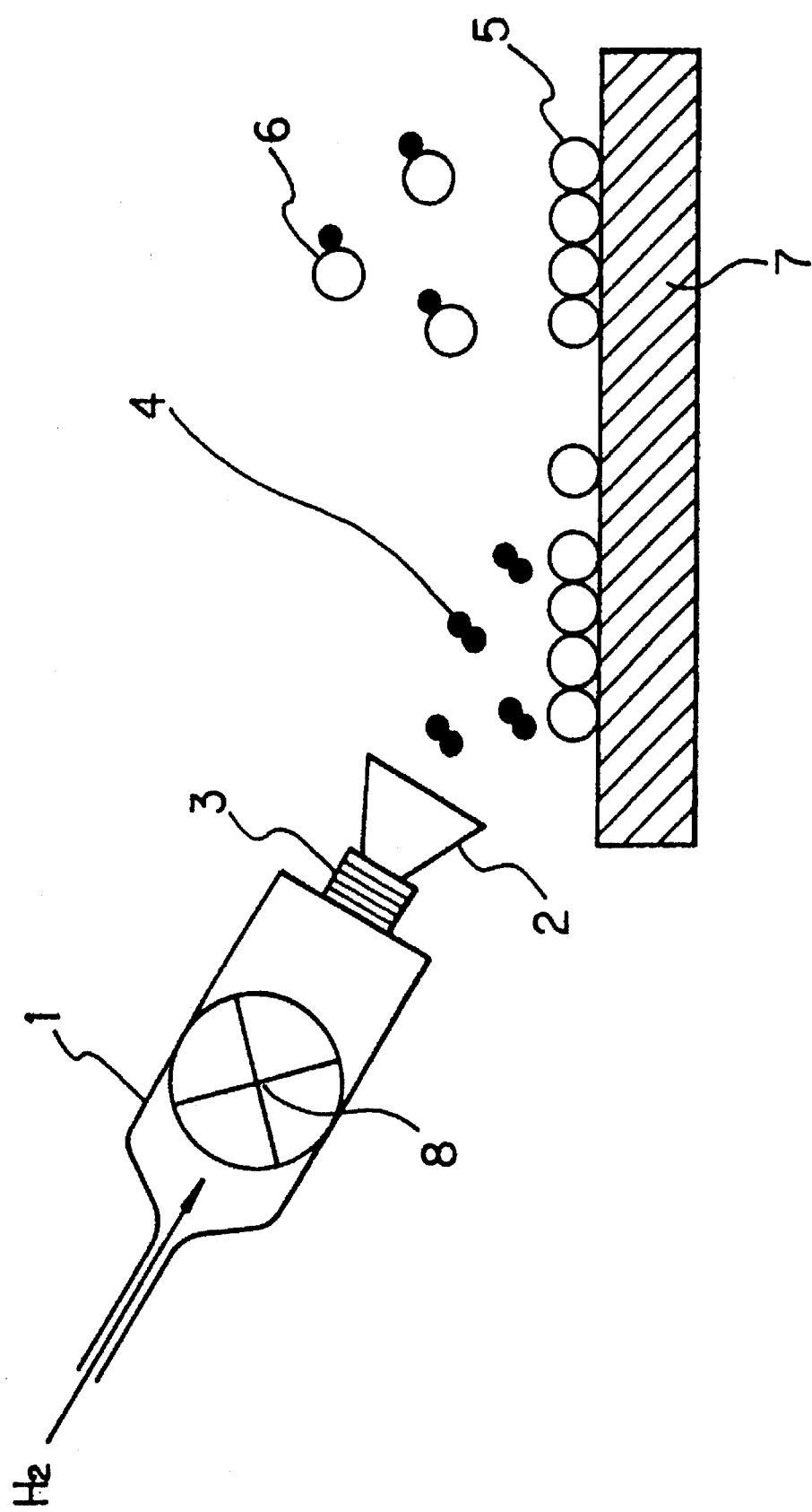
FIG. 1 is a schematic view showing an apparatus including a cavity and a nozzle for vibrationally-excitation of $H_2$ molecule gas, and a semiconductor substrate under growth which is supplied with vibrationally-excited $H_2$ molecule gas therefrom.

For this purpose, an apparatus for exciting the vibration of $H_2$ molecules is used in a preferred embodiment according to the invention as shown in FIG. 1. The vibrational-excitation of $H_2$ molecules is described in "J. Appl. Phys. 67, 1990, 604" by Zhu et al.

In FIG. 1, there is shown the vibrational-exciting apparatus including a cavity 1, a nozzle 2, an actuator 3, and an energy supply portion 8, in which mixture gas of $H_2$ molecules and Ar atoms is supplied to the cavity 1, and microwave energy is radiated to the mixture gas at the energy supply portion 8, so that $H_2$ molecules which are vibrationally-excited to be increased "0" to "1" in vibration level are supplied from the nozzle 2 to a surface of a crystal substrate 5 under epitaxial growth by means of the actuator 3. Thus, Cl atoms left on the crystal substrate 7 are removed in the form of HCl molecules by the reaction of $H_2$ molecules and Cl atoms.

Figure 2:
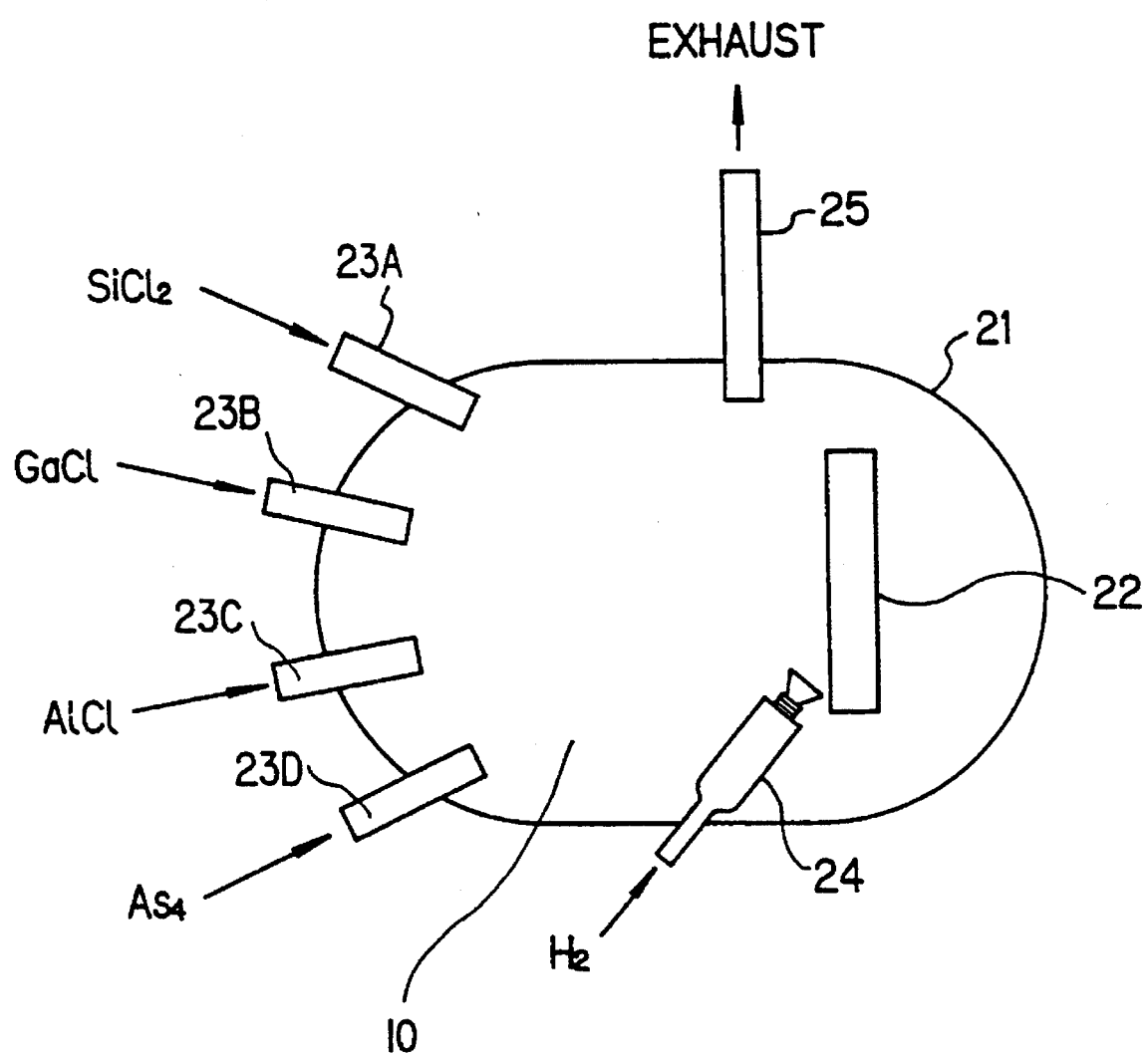
FIG. 2 is a plan view showing an epitaxial growth apparatus including an apparatus for supplying vibrationally-excited $H_2$ molecule gas to a semiconductor substrate under growth.

FIG. 2 shows an apparatus for epitaxial growth of a GaAs substrate by using GaCl molecules which comprises a growth chamber wall 21 for defining an epitaxial growth chamber 10 in which a GaAs crystal substrate 22 is grown epitaxially, gas ducts 23A–23D through one of which (23B) GaCl is supplied to the epitaxial growth chamber 10, an apparatus 24 (shown in FIG. 1) for supplying vibration-excited $H_2$ molecules to the GaAs crystal substrate 22, and an exhaust duct 25 for exhausting gases such as HCl, etc. from the chamber 10 to outside thereof.

In this apparatus, a growth chamber temperature is set at 200° C. in the crystal growth chamber 10, because the vibrationally-excited $H_2$ molecules are used in the preferred embodiment, although the temperature is set at 500° C. in the conventional apparatus removing Cl atoms from the crystal substrate surface. Then, the vibrationally-excited $H_2$ molecules are supplied from the nozzle 2 (FIG. 1) of the apparatus 24 to the crystal substrate 22 simultaneously with the supply of GaCl molecules of the gas duct 23B. Thus, Cl atoms are effectively removed from the surface of the crystal substrate 22, so that a growth time necessary for one layer of Ga layer is decreased to be one-fifth of that required in the conventional apparatus.

Figure 3:
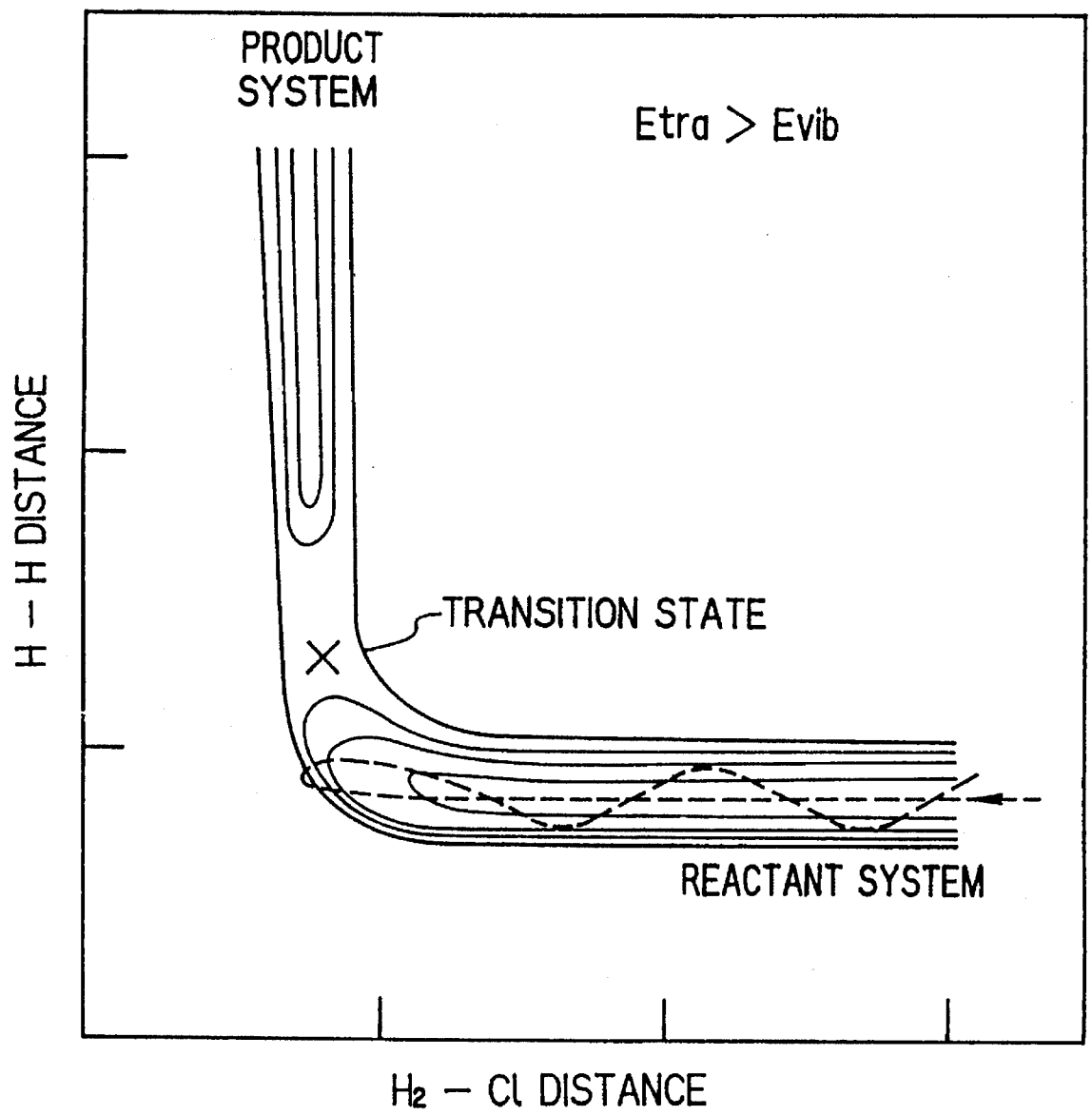
Figure 4:
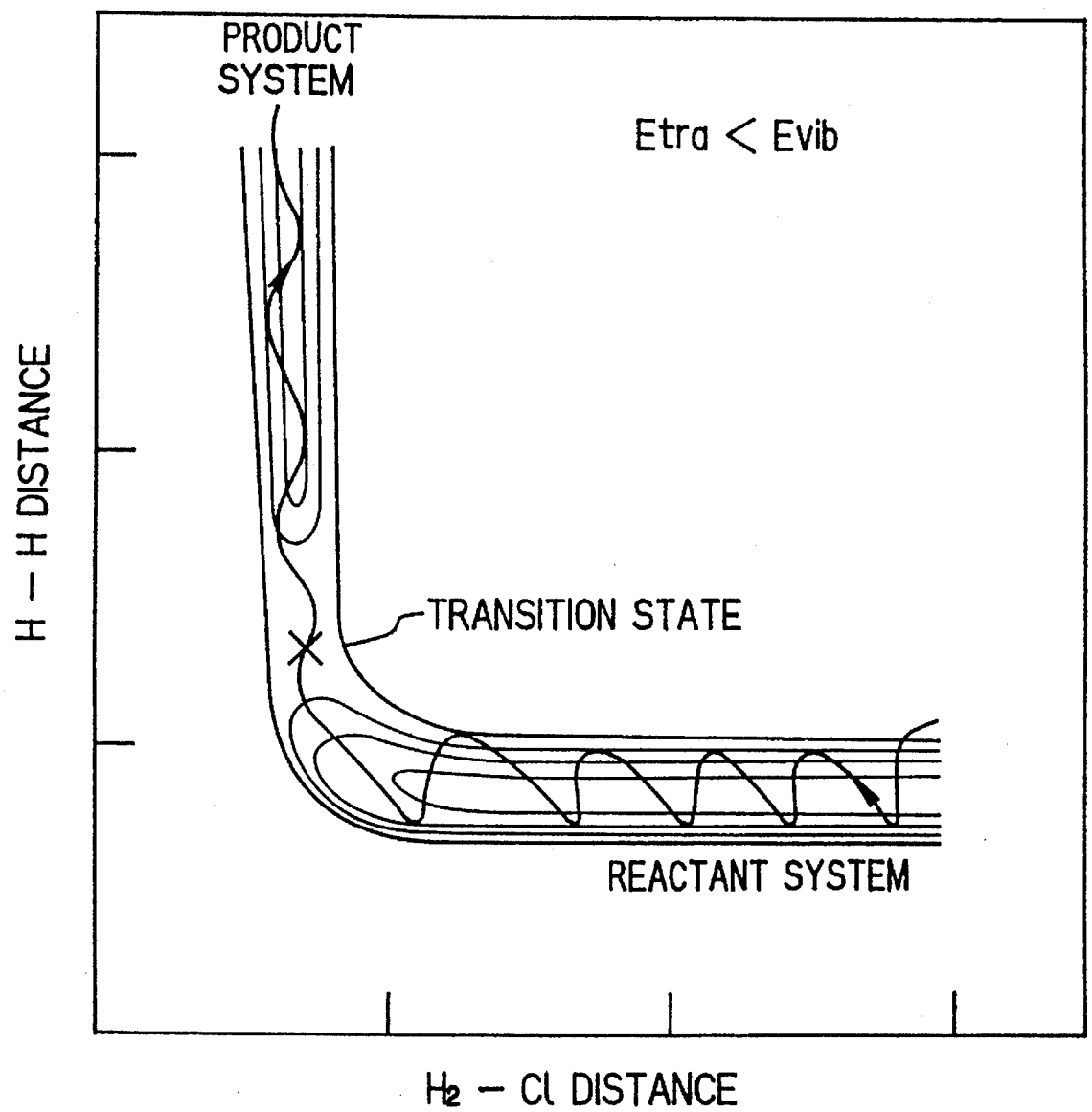

FIGS. 3 and 4 show classical trajectories of reaction, wherein a distance between $H_2$ molecule and Cl atom is along the horizontal axis, while a distance between H nucleuses in $H_2$ molecule is along the vertical axis.

In FIG. 3, it is explained that a probability for which a reaction is returned to the reactant system (the right and side of equal contour lines) before reaching the transition state (indicating by mark x) is high, because $H_2$ molecules are not vibrationally-excited, so that the reaction rate does not become so high.

On the other hand, FIG. 4 explains that a considerable amount of vibration energy is transformed to translation energy, despite that the translation energy is low, in a case where $H_2$ molecules are vibrationally-excited in a manner as explained in FIGS. 1 and 2, so that the probability for which the reaction proceeds beyond the transition state (the mark x) becomes high. That is, the removal reaction of Cl atoms is accelerated by vibrational-exciting $H_2$ molecules.

As apparent from the explanation in FIG. 4, the vibration energy $E_{vib}$ is transformed at the curved portion of the reaction path to the translation energy $E_{tra}$, so that the reaction can be overrided the transition state (the mark x). As a result, even if the translation energy $E_{tra}$ is lower than that in FIG. 3, the reaction is accelerated.

Figure 5:
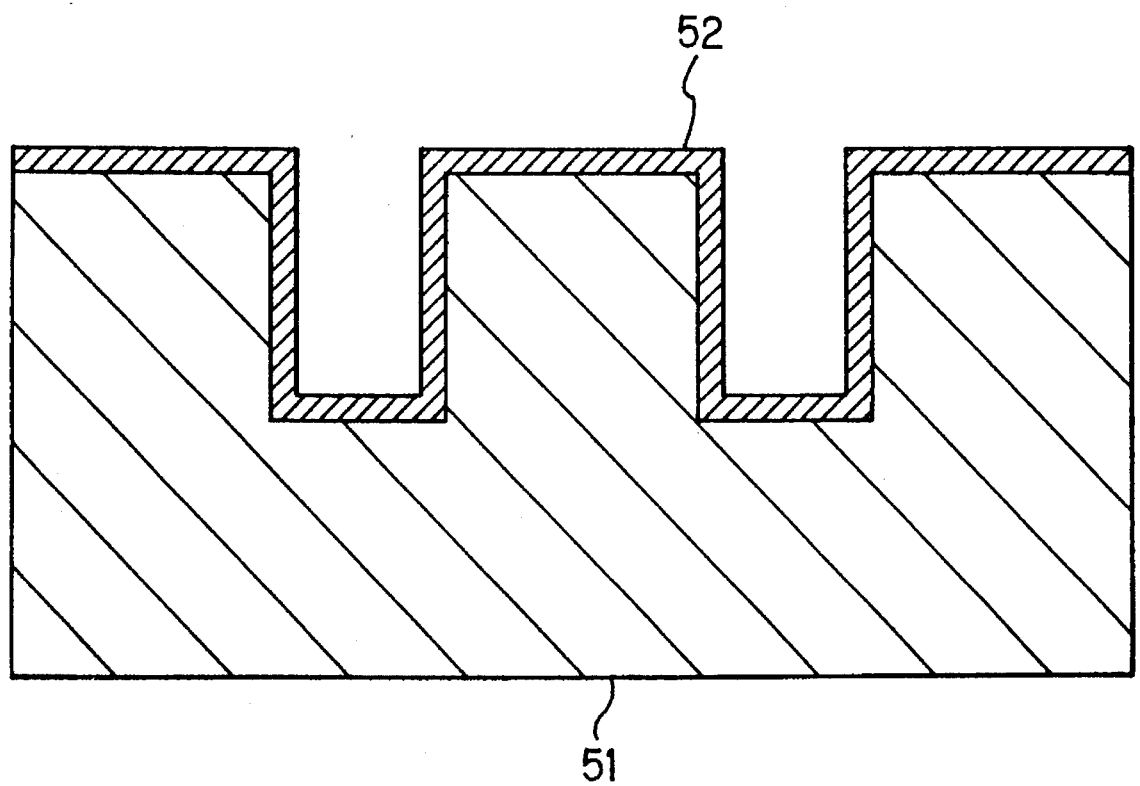
FIG. 5 is schematic cross-sectional view showing the epitaxial growth on side walls of grooves on a GaAs crystal substrate.

FIG. 5 shows a GaAs crystal substrate 51 having etched grooves covered on side walls with a well-controlled GaAs growth layer 52 which is epitaxially grown together with the supply of As from the gas dust 23D (FIG. 2). The GaAs growth layer 52 is of a property improved in surface uniformity as compared to the conventional one.

The invention is not only applied to the epitaxial growth of GaAs as described above, but also to the epitaxial growth of Si crystal by using $SiCl_2$ molecules supplied from the gas dust 23A (FIG. 2). In accordance with the invention, precise or nano-scale structures for quantum wells, quantum fine lines, etc. are fabricated with high uniforming and precision by a short time.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A method for epitaxial growth of a semiconductor crystal by using halogenide, said method comprising the steps of:

exciting $H_2$ molecules into vibration and supplying said vibrationally-excited $H_2$ molecules onto a surface of a semiconductor crystal substrate under epitaxial growth, said epitaxial growth being carried out by using halogenide, so that Cl atoms are left on said surface of said semiconductor crystals;

removing said Cl atoms on said surface of said semiconductor substrate in accordance with formation of HCl molecules between said vibration-excited $H_2$ molecules and said Cl atoms;

said halogenide being selected from a group consisting of GaCl and $SiCl_2$, and said epitaxial growth being carried out at a temperature of 200° C.

2. A method for epitaxial growth of semiconductor crystal by using halogenide, according to claim 1, further comprising the step of:

exhausting said molecules from said surface of said semiconductor crystal substrate to an exterior.

* * * * *